United States Patent
Lowrey

(10) Patent No.: US 6,501,111 B1
(45) Date of Patent: Dec. 31, 2002

(54) THREE-DIMENSIONAL (3D) PROGRAMMABLE DEVICE

(75) Inventor: Tyler Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,162

(22) Filed: Jun. 30, 2000

(51) Int. Cl.⁷ .................. H01L 29/76; H01L 29/94; H01L 31/062; H01L 31/113; H01L 31/119
(52) U.S. Cl. ................... 257/295; 257/40; 257/310
(58) Field of Search .................. 257/2–5, 296, 257/301, 295, 310, 40

(56) References Cited

U.S. PATENT DOCUMENTS

| | | | |
|---|---|---|---|
| 5,296,716 A | * 3/1994 | Ovshinsky et al. | 257/3 |
| 5,789,758 A | 8/1998 | Reinberg | 257/3 |
| 5,879,955 A | 3/1999 | Gonzalez et al. | 437/197 |
| 5,920,788 A | * 7/1999 | Reinberg | 438/466 |
| 5,933,365 A | 8/1999 | Klersy et al. | |
| 5,970,336 A | 10/1999 | Wolstenholme et al. | 438/238 |
| 5,998,244 A | 12/1999 | Wolstenholme et al. | 438/128 |
| 6,002,140 A | 12/1999 | Gonzalez et al. | 257/3 |
| 6,031,287 A | 2/2000 | Harshfield | |
| 6,087,674 A | 7/2000 | Ovshinsky et al. | |
| 6,153,890 A | * 11/2000 | Wolstenholme | 257/3 |
| 6,229,157 B1 | * 5/2001 | Sandhu | 257/75 |
| 6,236,059 B1 | * 5/2001 | Wolstenholme | 257/3 |
| 6,284,643 B1 | * 9/2001 | Reinberg | 438/622 |
| 6,369,431 B1 | * 4/2002 | Gonzalez et al. | 257/390 |

* cited by examiner

*Primary Examiner*—Eddie Lee
*Assistant Examiner*—Jesse A. Fenty
(74) *Attorney, Agent, or Firm*—Anthony M. Martinez

(57) ABSTRACT

A three-dimensional (3D) memory device having polysilicon diode isolation elements for chalcogenide memory cells and method for fabricating the same are described. The memory device includes a plurality of stacked memory cells to form a three-dimensional (3D) memory array. The memory device also includes a polysilicon diode isolation element to select a chalcogenide memory cell. The memory device is fabricated by forming a plurality of chalcogenide memory cells on a base insulator. The memory device is also fabricated by forming a polysilicon diode isolation element to select a chalcogenide memory cell.

13 Claims, 4 Drawing Sheets

THREE-DIMENSIONAL (3D) PROGRAMMABLE DEVICE

FIELD OF THE INVENTION

The present invention relates generally to semiconductor memory devices and methods for fabricating the same. More particularly, the present invention relates to a three-dimensional (3D) memory device having polysilicon diode isolation elements for chalcogenide memory cells and method for fabricating the same.

BACKGROUND

Prior art memory devices use two-dimensional (2D) memory cell arrays, which are formed on a top surface of a silicon substrate. The memory cells. are matrixed in a 2D array in the X-Y plane and thus addressed by X and Y address lines. The prior art memory devices also include isolation elements to select the memory cells. The isolation elements are generally made of metal oxide semiconductor (MOS) transistors.

A disadvantage with the prior art memory devices is that they are limited to the X-Y plane thus limiting memory density for such devices. That is, the MOS transistor isolation elements require physical use of the top surface of the silicon substrate to select a memory cell which limits memory cell arrays being formed in the X-Y plane on the silicon substrate.

BRIEF DESCRIPTION OF THE DRAWINGS

The features and advantages of the present invention are illustrated by way of example and not intended to be limited the figures of the accompanying drawings in which like references indicate similar elements and in which.

DETAILED DESCRIPTION

A three-dimensional (3D) memory device having polysilicon diode isolation elements for chalcogenide memory cells and method for fabricating the same are described. The memory device includes a plurality of stacked memory cells to form a three-dimensional (3D) memory array. The memory device also includes a polysilicon diode isolation element to select a chalcogenide memory cell. The memory device is fabricated by forming a plurality of chalcogenide memory cells on a base insulator. The memory device is also fabricated by forming a polysilicon diode isolation element to select a chalcogenide memory cell.

By forming a polysilicon diode isolation element to select a chalcogenide memory cell, the memory device can facilitate vertical stacking of memory cells thereby allowing for 3D memory arrays. As such; the memory device density can be increased in the vertical direction ("Z-direction"). Thus, the memory device described herein is not limited to the X-Y plane for increasing memory density.

Furthermore, by using a chalcogenide memory cell, operation of the memory device does not require use of the top surface of a silicon substrate and does not require high on to off conduction ratio isolation switching elements. Thus, combining chalcogenide memory cells with polysilicon diode isolation elements removes the requirements for using the surface of the silicon substrate thereby allowing vertical memory cell array integration for 3D memory cell arrays.

Furthermore, in the following embodiments, a layer or material can be selectively patterned using any combination of a deposition process, photolithography process, dry or wet etching process, liftoff process, or other semiconductor processes.

Figure 1:
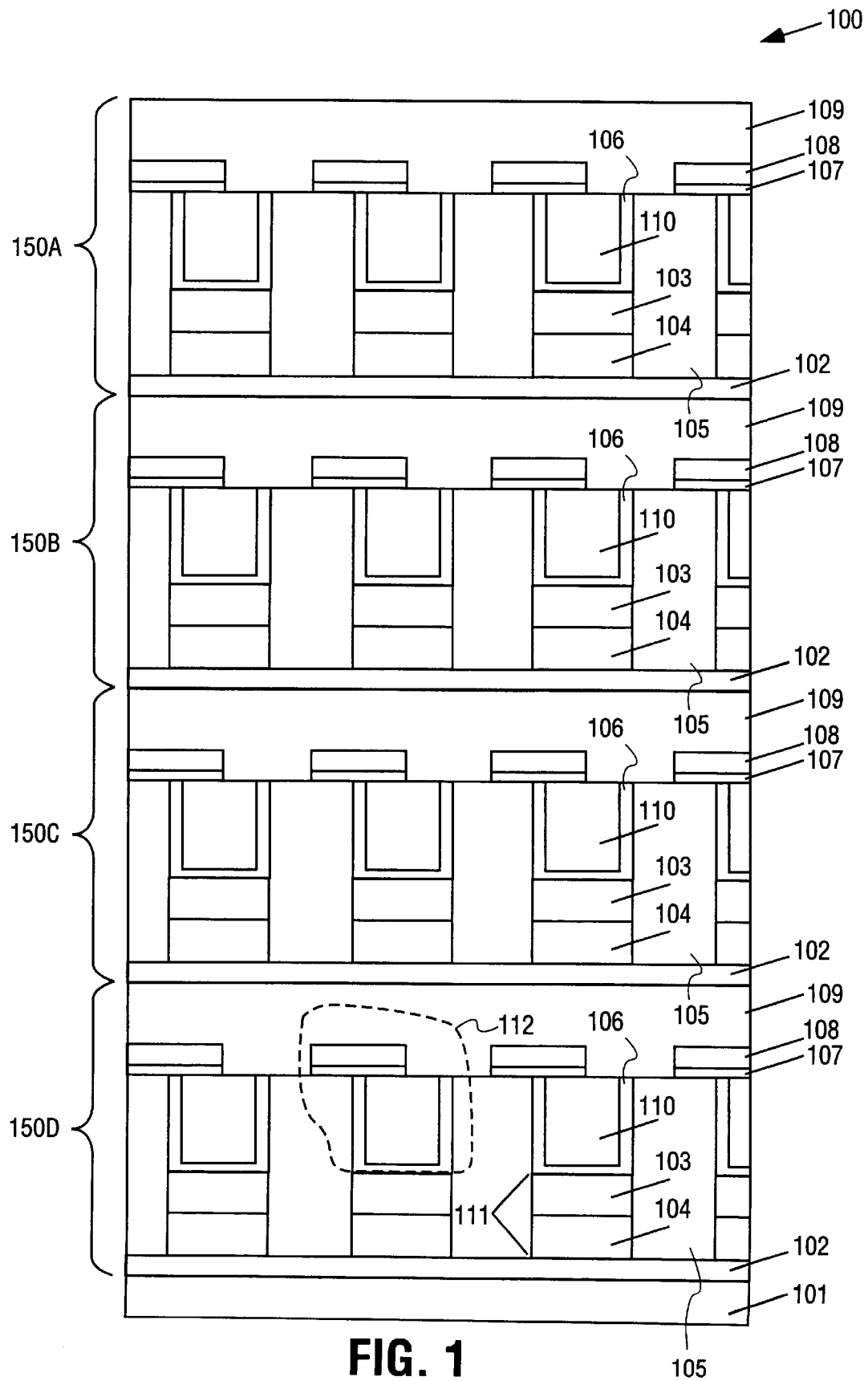
FIG. 1 depicts a cross-sectional side view of a section of a memory device having three-dimensional (3D) memory cell arrays according to one embodiment.

FIG. 1 depicts a cross-sectional side view of a section 100 of a memory device having three-dimensional (3D) memory cell arrays according to one embodiment. Referring to FIG. 1, a memory device having four stacked memory cell arrays (150A through 150D) is shown. Nevertheless, the memory device may have any number of stacked memory cell arrays. In the following description of FIG. 1, the stacked memory cell arrays are stacked chalcogenide memory cell arrays.

As shown in FIG. 1, the stacked memory array 150D is supported by a base insulation layer 101. Base insulation layer 101 may be an oxide layer, nitride layer, polymer layer, silicon dioxide $SiO_2$ layer, or other like insulation layers. Thus, base insulation layer 101 supports the stacked memory cell arrays (150A through 150D). Alternatively, base insulation layer 101 may be formed on a silicon substrate, in which the base insulation layer 101 and the silicon substrate would support the stacked memory cell arrays (150A through 150D). Furthermore, base insulation layer 101 may be a silicon substrate. Nevertheless, the base for the stacked memory cell arrays (150A through 150D) is not required to select or operate a memory cell within the stacked memory cell arrays (150A through 150D).

Each stacked memory cell array includes isolation diodes 111 for memory cells 112. Memory cells 112 are chalcogenide memory cells 112. The isolation diodes 111 and corresponding chalcogenide memory cells 112 are separated by insulation layer 105. The isolation diodes 111 are formed on a row line conductor 102 and connect with chalcogenide memory cells 112. The chalcogenide memory cells 112 are separated from chalcogenide memory cells 112 of other stacked memory cell arrays by insulation layer 109.

The isolation diodes 111 are polysilicon diode isolation elements. Isolation diodes 111 include a P doped layer 103 formed on an N doped layer 104. Alternatively, layer 103 can be an N doped layer and layer 104 can be a P doped layer. Layer 103 is thus connected with lower electrodes 106 of each of the chalcogenide memory cells 112.

Chalcogenide memory cells 112 include lower electrodes 106, insulation layer 110, chalcogenide layer 107, and column conductor 108. The lower electrodes 106 are formed on isolation diodes 111 having insulation layer 110 formed in between sidewalls of the lower electrodes 106. The chalcogenide layer 107 is formed on portions of lower electrodes 106, insulation layer 110, and insulation layer 105. The column conductor 108 is formed on the chalcogenide layer 107.

A chalcogenide memory cell uses the properties of a phase changing material (i.e., "chalcogenide") to program a memory cell. Chalcogenide is a material, which can be electrically switched between generally amorphous states (highly resistive) and generally crystalline states (highly conductive). For example, in its amorphous state, chalcogenide exhibits a lower conductivity than its crystalline form. As such, a memory cell can be programmed by switching between the different states of chalcogenide. The programming of chalcogenide memory cells 112 can be achieved by applying selectively voltages on lower electrodes 106 that control the state of the chalcogenide layer 107.

For each level of the stacked memory arrays (150A through 150D), the bottom row line conductor 102 serves as the row line or X-address line. The column conductor 108 formed on top of the chalcogenide layer 107 serves as the column or Y-address line. The memory plane can be used as the Z-address line. By using selectively row line conductor 102 and column conductor 108, the state of chalcogenide layer 107 can be read.

FIGS. 2A through 2E depict cross-sectional side views illustrating one embodiment of a process for fabricating a memory device having the 3D memory cell arrays of FIG. 1. For one embodiment, the memory cells are chalcogenide memory cells and are isolated by isolation diodes.

Figure 2A:
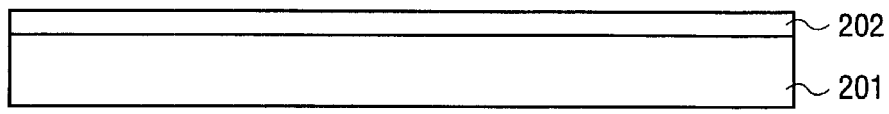
FIGS. 2A through 2E depict cross-sectional side views illustrating one embodiment of a process for fabricating a memory device having the 3D memory cell arrays of FIG. 1.

Referring to FIG. 2A, a low resistive conductor is deposited on a planar base insulation layer 201 and is selectively patterned to form row line conductor 202. For example, a polysilicon layer or a polysilicon layer strapped with tungsten silicide $WSi_x$ or cobalt silicide $CoSi_2$ or other like low resistive conductor is deposited on base insulation layer 201 to form row line conductor 202. Row line conductor 202 is patterned to form row line stripes on base insulation layer 201. Base insulation layer 201 may be an oxide, polymer, nitride, polysilicon, or other like material to support the memory arrays. Alternatively, base insulation layer 201 may be supported by a silicon substrate to support the memory arrays. Furthermore, base insulation layer 201 may be a silicon substrate.

Figure 2B:
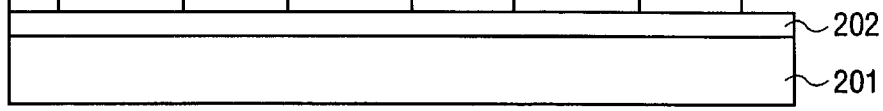

Referring to FIG. 2B, an insulation layer is deposited on row line conductor 202 and base insulation layer 201. The insulation layer may be planarized as an optional step. For example, a silicon dioxide layer $SiO_2$ or other like insulation layer may be deposited on row line conductor 202 and base insulation layer 201, which may be planarized in an option step. The insulation layer is then selectively etched to form insulation layer 205 having "holes" formed therein. For one embodiment, the holes are cylindrical.

Figure 2C:
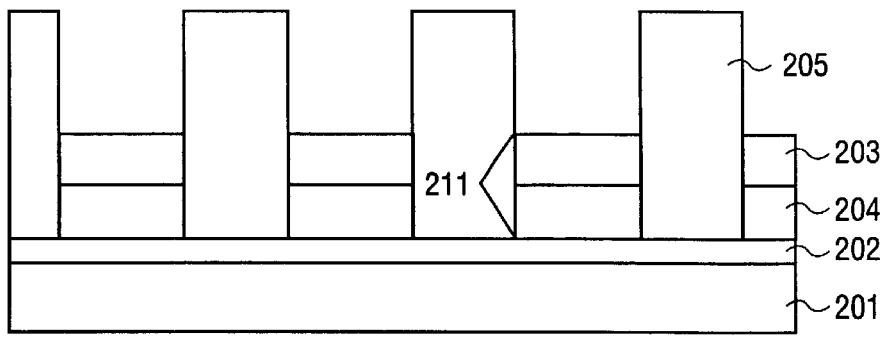

Referring to FIG. 2C, a polysilicon layer is then deposited into the holes to plug the holes. The polysilicon layer is then recessed down into the holes. For example, the polysilicon layer can be recessed down by using a combination of a chemical mechanical polish (CMP) process and a dry etching process or by using only a dry etching process. The polysilicon layer is then doped to form P doped layer 203 and N doped layer 204. For example, the polysilicon layer can be doped using an ion implantation process. Alternatively, layer 203 can be an N doped layer and layer 204 can be a P doped layer. Layers 203 and 204 thus form a polysilicon diode 211, which operates as an isolation element to select a chalcogenide memory cell.

Figure 2D:
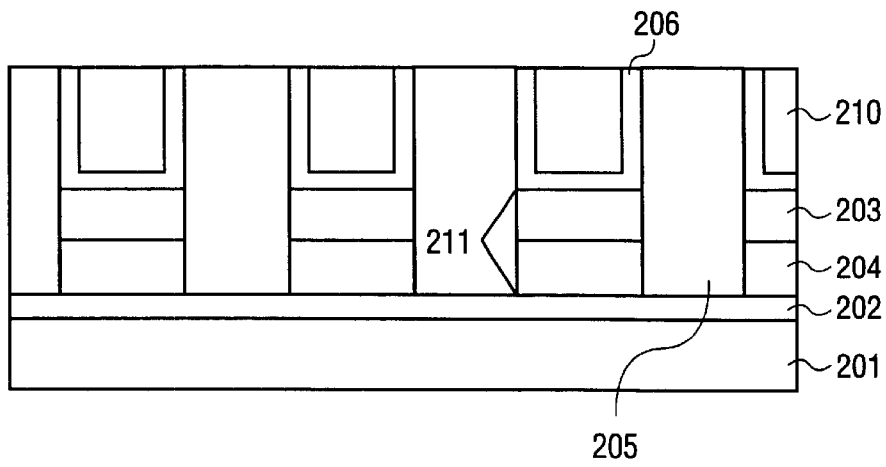

Referring to FIG. 2D, an electrode layer is formed in the remaining holes defined by insulation layer 205, which coats the top surface of layer 203 and sidewalls of insulation layer 205, to form lower electrodes 206. For example, a polysilicon layer or a titanium nitride TiN layer or other electrode layer can be used to form lower electrodes 206.

Next, an insulation material is deposited that plugs or fills the remaining area of the "holes" defined by lower electrodes 206, which forms insulation layer 210. For example, an oxide layer or silicon oxide $SiO_2$ layer or other like insulation layers may be used to form insulation layer 210. Subsequently, any insulating layer 210 and lower electrodes 206 formed on insulation layer 205 is then removed using a CMP process and/or a dry etching process.

Figure 2E:
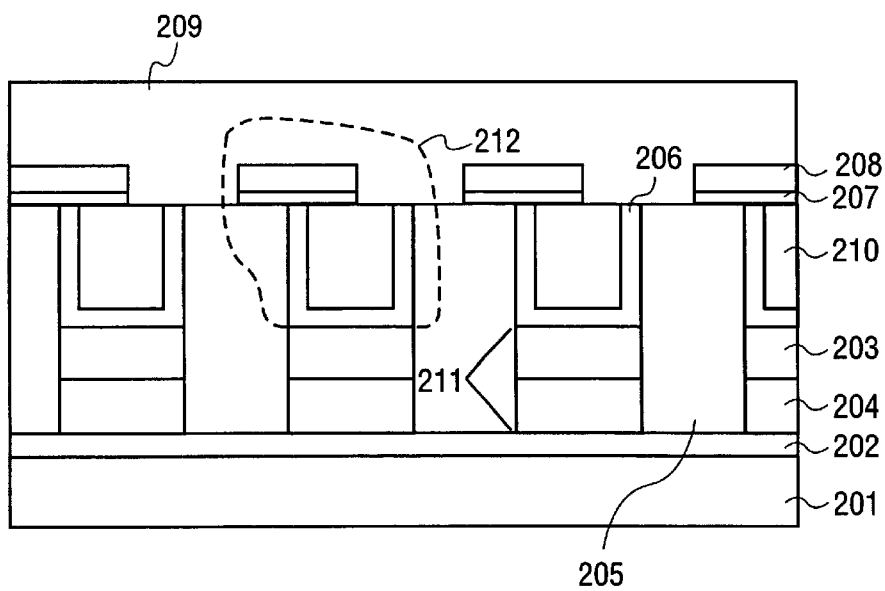

Referring to FIG. 2E, a chalcogenide film is the deposited on insulation layers 210 and 205 and lower electrodes 206 and then patterned to form chalcogenide layer 207. A conductive material is then deposited over the chalcogenide layer 207 and patterned to form column conductor 208. For example, tungsten W or aluminum Al or titanium Ti or other like conductive material may be deposited over chalcogenide layer 207 and patterned to form column conductor 208.

The chalcogenide layer 207 and column conductor 208 may be patterned to form column stripes. An insulation layer may then be deposited on top of the device to form insulation layer 209 as shown in FIG. 2E. Insulation layer 219 may be planarized in an option step. This sequence of processing steps can be repeated for as many subsequent memory cell array levels as are desired.

The thusly fabricated memory device serves to provide 3D memory cell arrays, which can provide for increased memory density in the vertical direction. That is, the thusly fabricated memory device is not limited to the X-Y plane for increasing the density of the memory device.

Figure 3:
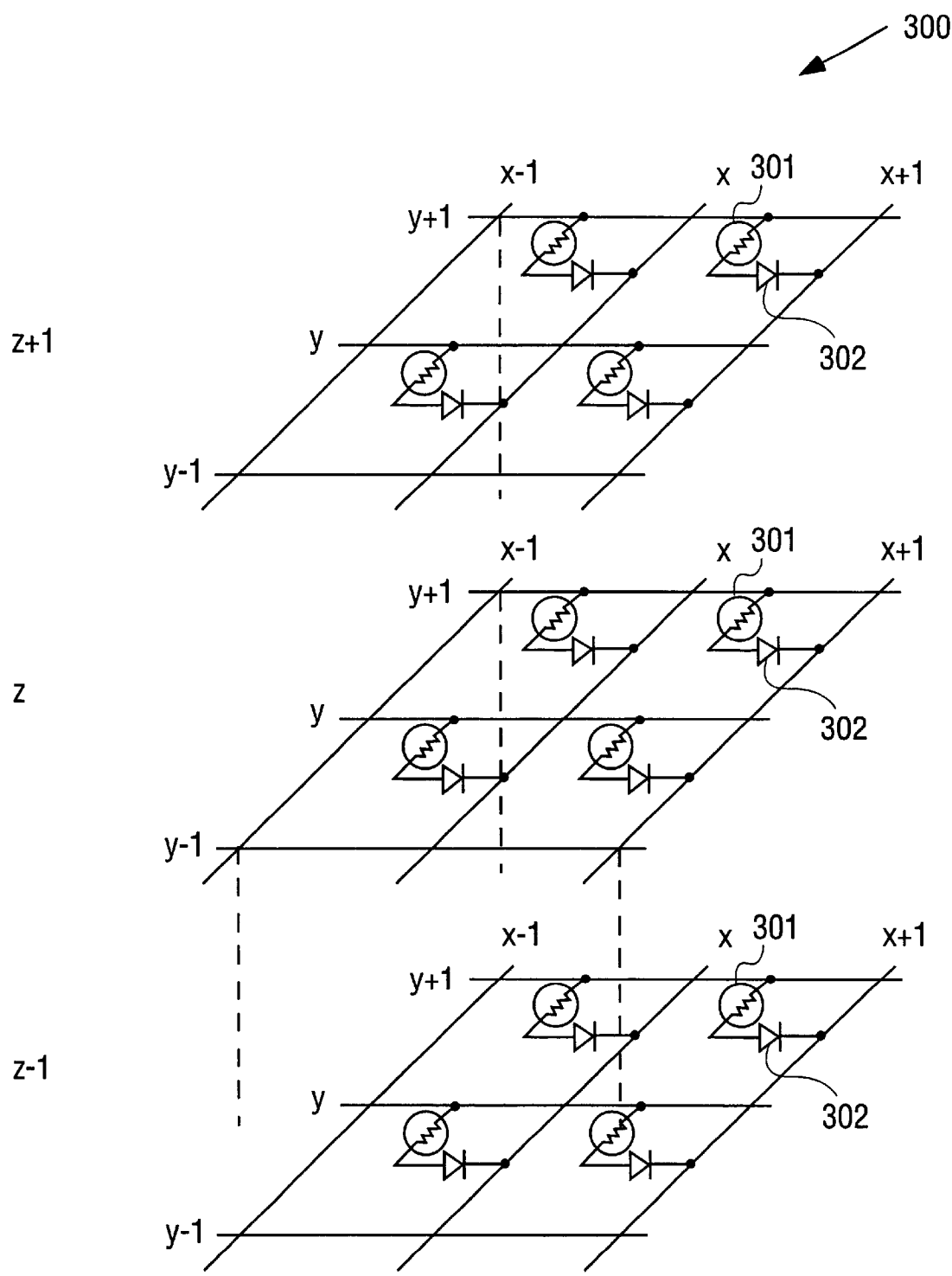
FIG. 3 depicts a 3D schematic circuit diagram for a memory device to illustrate 3D memory cell array operation according to one embodiment.

FIG. 3 depicts a 3D schematic circuit diagram 300 for a memory device cot to illustrate 3D memory cell array operation according to one embodiment. Referring to FIG. 3, the three levels (Z+1, Z, Z−1) include memory cells 301 with corresponding isolation diodes 302, which can be addressed by X−1 to X+1 and Y−1 to Y+1 address lines. To select a memory cell 301 on the Z+1 level, the X and Y address lines are selected for that level. Hence, multiple memory cells 301 on multiple levels can be accessed simultaneously.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

I claim:

1. A memory device comprising:
   a plurality of memory cells each memory cell comprising a programmable portion and an isolation element, the isolation element displaced in an opening formed through an insulation material separating the programmable portion from a signal line, the programmable portion coupled to the signal line through the isolation element and an electrode, wherein a first programmable portion of a first memory cell is formed in a first plane over a substrate and a second programmable portion of a second memory cell is formed in a second different plane to form a three-dimensional (3D) memory array, wherein the electrode is formed on the isolation element and along a wall of an opening through the insulation material.

2. The memory device of claim 1, where each isolation element is a polysilicon diode.

3. The memory device of claim 1, wherein the programmable portion of each memory cell is a chalcogenide material.

4. The memory device of claim 1, further comprising:
   a base insulator layer to support the plurality of stacked memory cells.

5. The memory device of claim 1 further comprising:

an insulating layer between the first plane and the second plane.

6. The memory device according to claim 1, further comprising:

a second insulation material formed on the electrode.

7. A memory device comprising:

a plurality of memory cells each memory cell comprising a chalcogenide portion, wherein a first chalcogenide portion of a first memory cell is formed in a first plane over a substrate and a second chalcogenide portion of a second memory cell is formed in a second different plane in a three dimensional (3D) array;

a plurality of isolation elements, each isolation element used to select one of the plurality of chalcogenide memory cells; and a plurality of signal lines, ones of the plurality of signal lines coupled to at least one of the plurality of memory cells, respective ones of the plurality of isolation elements and an electrode separating the ones of the plurality of signal lines and the at least one of the plurality of memory cells, wherein the respective ones of the plurality of isolation elements are displaced in openings formed through insulation material separating the at least one memory cell and the ones of the plurality of signal lines, wherein the electrode is formed on the isolation element and along a wall of an opening through the insulation material.

8. The memory device of claim 7, wherein each isolation element is a polysilicon diode isolation element.

9. The memory device of claim 7, wherein the ones of the plurality of signal lines are first address lines, the memory device further comprising:

a plurality of second address lines, one of the plurality of second address lines coupled to the at least one of the plurality coupled to the memory cells.

10. The memory device of claim 7, further comprising:

a base insulation layer to support the plurality of memory cells and isolation elements.

11. The memory device of claim 7 further comprising:

an insulating layer between the first plane and the second plane.

12. The memory device according to claim 7, further comprising:

a second insulation material formed on the electrode.

13. A memory device comprising:

a plurality of memory cells each memory cell comprising a chalcogenide portion, wherein a first chalcogenide portion of a first memory cell is formed in a first plane over a substrate and a second chalcogenide portion of a second memory cell is formed in a second different plane in a three dimensional (3D) array;

a plurality of isolation elements, each isolation element used to select one at the plurality of chalcogenide memory cells; and a plurality of signal lines, ones of the plurality of signal lines coupled to at least one of the plurality of memory cells, respective ones of the plurality of isolation elements and an electrode separating the ones of the plurality of signal lines and the at least one of the plurality of memory cells, wherein the electrode has a vertical portion and a horizontal portion, the vertical portion coupled to a portion of the lower surface of the first chalcogenide portions.

* * * * *